US006762502B1

(12) United States Patent
Akram

(10) Patent No.: US 6,762,502 B1
(45) Date of Patent: Jul. 13, 2004

(54) SEMICONDUCTOR DEVICE PACKAGES INCLUDING A PLURALITY OF LAYERS SUBSTANTIALLY ENCAPSULATING LEADS THEREOF

(75) Inventor: Salman Akram, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/651,930

(22) Filed: Aug. 31, 2000

(51) Int. Cl.$^7$ .......................... H01L 23/48; H01L 23/52; H01L 29/40

(52) U.S. Cl. ................. 257/781; 257/642; 257/683; 257/684; 257/778; 257/737; 257/738; 257/693; 257/729; 257/796

(58) Field of Search ..................... 257/784, 684, 257/673, 646, 690–693, 696, 698, 700, 701, 796, 787, 786, 778, 734, 737, 738, 781, 642, 683, 782, 783, 729, 632

(56) References Cited

U.S. PATENT DOCUMENTS

| | | | |
|---|---|---|---|
| 4,862,245 A | | 8/1989 | Pashby et al. |
| 5,173,220 A | | 12/1992 | Reiff et al. |
| 5,209,390 A | | 5/1993 | Temple et al. |
| 5,264,061 A | | 11/1993 | Juskey et al. |
| 5,278,442 A | | 1/1994 | Prinz et al. .................. 257/687 |
| 5,304,842 A | | 4/1994 | Farnworth et al. |
| 5,477,086 A | | 12/1995 | Rostoker et al. |
| 5,484,314 A | | 1/1996 | Farnworth ................. 445/24 |
| 5,551,148 A | | 9/1996 | Kazui et al. |
| 5,677,576 A | | 10/1997 | Akagawa |
| 5,684,330 A | * | 11/1997 | Lee ........................... 257/692 |
| 5,705,117 A | | 1/1998 | O'Connor et al. |
| 5,786,626 A | * | 7/1998 | Brady et al. .................. 257/673 |
| 5,892,288 A | * | 4/1999 | Muraki et al. ............... 257/778 |
| 5,894,107 A | | 4/1999 | Lee et al. |
| 5,907,477 A | | 5/1999 | Tuttle et al. |
| 5,965,933 A | * | 10/1999 | Young et al. ............... 257/684 |
| 5,999,413 A | * | 12/1999 | Ohuchi et al. .............. 257/738 |
| 6,028,354 A | * | 2/2000 | Hoffman .................... 257/796 |
| 6,060,768 A | * | 5/2000 | Hayashida et al. .......... 257/666 |
| 6,084,781 A | | 7/2000 | Klein |
| 6,221,697 B1 | * | 4/2001 | Su et al. ..................... 257/698 |
| 6,251,488 B1 | | 6/2001 | Miller et al. |
| 6,259,962 B1 | | 7/2001 | Gothait |
| 6,268,584 B1 | | 7/2001 | Keicher et al. |
| 6,281,046 B1 | | 8/2001 | Lam |
| 6,288,905 B1 | * | 9/2001 | Chung ........................ 257/668 |
| 6,306,752 B1 | * | 10/2001 | DiStefano et al. .......... 438/618 |
| 6,323,058 B1 | * | 11/2001 | Murakamz et al. ......... 257/712 |
| 6,326,698 B1 | * | 12/2001 | Akram ....................... 257/781 |
| 6,337,122 B1 | | 1/2002 | Grigg et al. |
| 6,391,251 B1 | | 5/2002 | Keicher et al. |
| 6,432,752 B1 | | 8/2002 | Farnworth |
| 6,468,891 B2 | * | 10/2002 | Williams .................... 438/597 |
| 6,482,576 B1 | | 11/2002 | Farnworth et al. |
| 6,489,007 B2 | | 12/2002 | Grigg et al. |
| 6,493,932 B1 | | 12/2002 | Haba |
| 6,514,798 B2 | | 2/2003 | Farnworth |
| 6,524,346 B1 | | 2/2003 | Farnworth |
| 6,544,821 B2 | * | 4/2003 | Akram ....................... 438/127 |
| 6,544,902 B1 | | 4/2003 | Farnworth |
| 6,549,821 B1 | | 4/2003 | Farnworth et al. |
| 6,551,917 B2 | | 4/2003 | Cobbley et al. |
| 6,562,278 B1 | | 5/2003 | Farnworth et al. |
| 6,585,927 B2 | | 7/2003 | Grigg et al. |
| 6,590,295 B1 | | 7/2003 | Liao et al. |
| 6,593,171 B2 | | 7/2003 | Farnworth |
| 6,600,171 B1 | | 7/2003 | Farnworth et al. |
| 6,613,662 B2 | | 9/2003 | Wark et al. |
| 6,630,736 B1 | | 10/2003 | Ignaut |
| 6,635,333 B2 | | 10/2003 | Grigg et al. |
| 2001/0038144 A1 | * | 11/2001 | Grigg ......................... 257/698 |
| 2002/0098623 A1 | * | 7/2002 | Akram ....................... 438/123 |

OTHER PUBLICATIONS

U.S. Patent Application Publication 2002/0066966 A1 to Farnworth, dated Jun. 6, 2002.
U.S. Patent Application Publication 2002/0171177 A1 to Kritchman et al., dated Nov. 21, 2002.
U.S. Patent Application Publication 2002/0182782 A1 to Farnworth, dated Dec. 5, 2002.
U.S. Patent Application Publication 2003/0003180 A1 to Farnworth et al., dated Jan. 2, 2003.
U.S. Patent Application Publication 2003/0003380 A1 to Farnworth et al., dated Jan. 2, 2003.
U.S. Patent Application Publication 2003/0003405 A1 to Farnworth et al., dated Jan. 2, 2003.
U.S. Patent Application Publication 2003/0043360 A1 to Farnworth, dated Mar. 6, 2003.

(List continued on next page.)

*Primary Examiner*—Alexander O. Williams
(74) *Attorney, Agent, or Firm*—TraskBritt

(57) ABSTRACT

A method for forming semiconductor device packages including one or more semiconductor dice, leads in communication with bond pads of the dice, and a protective layer, or package, over at least the active surfaces of the semiconductor dice. The protective layer covers at least the bond pads, the proximate regions of the corresponding leads, and the conductive elements between the bond pads and their corresponding leads. The leads are at least electrically exposed through the protective layer. A portion of each lead may be physically exposed through the protective layer so as to facilitate connection of each lead to external circuitry. The packages may also include protective layers over the back sides or the edges of the semiconductor dice. A stereolithographic process is used for precisely forming the protective layers of the package. A machine vision system is used in connection with stereolithographic equipment to locate individual dice, features thereof, or leads. Openings are integrally formed in the protective layer over the active surface to facilitate the connection of external conductive structures to the leads. The completed CSP device is precisely encapsulated with minimal lateral dimensions, and has an array of precisely positioned external connectors.

40 Claims, 8 Drawing Sheets

OTHER PUBLICATIONS

U.S. Patent Application Publication 2003/0068584 A1 to Farnworth et al., dated Apr. 10, 2003.
U.S. Patent Application Publication 2003/0072926 A1 to Grigg et al., dated Apr. 17, 2003.
U.S. Patent Application Publication 2003/0077418 A1 to Grigg et al., dated Apr. 24, 2003.
U.S. Patent Application Publication 2003/0089999 A1 to Akram, dated May 15, 2003.
U.S. Patent Application Publication 2003/0092220 A1 to Akram, dated May 15 2003.
U.S. Patent Application Publication 2003/0093173 A1 to Farnworth et al., dated May 15, 2003.
U.S. Patent Application Publication 2003/0102566 A1 to Farnworth, dated Jun. 5, 2003.
U.S. Patent Application Publication 2003/0129787 A1 to Farnworth, dated Jul. 10, 2003.
U.S. Patent Application Publication 2003/0151167 A1 to Kritchman et al., dated Aug. 14, 2003.
U.S. Patent Application Publication 2003/0201531 A1 to Farnworth et al., dated Oct. 30, 2003.
U.S. Patent Application Publication 2003/0203158 A1 to Farnworth et al., dated Oct. 30, 2003.
U.S. Patent Application Publication 2003/0207213 A1 to Farnworth, dated Nov. 6, 2003.
Miller et al., "Maskless Mesoscale Materials Deposition", Deposition Technology, Sep. 2001, pp. 20–22.
Mille, "New Laser–Directed Deposition Technology", Microelectronic Fabrication, Aug. 2001, p. 16.
Webpage, Object Prototyping the Future, "Objet FullCure700 Series", 1 page.
Webpage, Objet Prototyping the Future, "How it Works", 2 pages.
U.S. patent application Ser. No. 09/589,841, filed Jun. 8, 2000, entitled "Stereolithographic Methods for Forming a Protective Layer on a Semiconductor Device Substrate and Substrates Including Protective Layers So Formed", inventor Farnworth et al..
U.S. patent application Ser. No. 10/370,755, filed Feb. 20, 2003, entitled "Chip Scale Package Structures and Method of Forming Conductive Bumps Thereon", inventor Warren M. Farnworth.
U.S. patent application Ser. No. 10/608,749, entitled "Methods for Labeling Semiconductor Device Components", inventor Grigg et al..
U.S. patent application Ser. No. 10/619,918, filed Jul. 15, 2003, entitled "Stereolithographic Methods for Fabricating Hermetic Semiconductor Device Packages and Semiconductor Devices Including Stereolithographically Fabricated Hermetic Packages", inventor Warren M. Farnworth.
U.S. patent application Ser. No. 10/672,098, filed Sep. 26, 2003, entitled "Apparatus and Methods for Use in Stereolithographic Processing of Components and Assemblies", inventor Warren M. Farnworth.
U.S. patent application Ser. No. 10/690,417, filed Oct. 20, 2003, entitled "Methods of Coating and Singulating Wafers and Chip–Scale Packages Formed Therefrom", inventor Farnworth et al..

* cited by examiner

SEMICONDUCTOR DEVICE PACKAGES INCLUDING A PLURALITY OF LAYERS SUBSTANTIALLY ENCAPSULATING LEADS THEREOF

BACKGROUND OF THE INVENTION

1. Field of the Invention

The present invention relates generally to semiconductor device packages including leads that are electrically exposed through the packages and to methods for fabricating such semiconductor device packages. More particularly, the present invention relates to semiconductor device packages in which the leads are substantially encapsulated and to methods for fabricating these semiconductor device packages. The present invention also pertains to the use of stereolithography in the packaging of electronic components.

2. Background of Related Art

SEMICONDUCTOR DEVICE PACKAGES

The large-scale production of particular types of semiconductor devices poses problems peculiar to the type of die, electronic circuits, external connectors and packaging. So-called chip scale packages are defined as packaged dice having dimensions substantially the same as the die itself, particularly in length and width. The height of the finished package may be greater than the bare die because of the connecting elements (bond pads, lead frame, wire bonds, and external connectors such as solder balls) which are included in the package.

In order to manufacture semiconductor dice in quantity, a wafer comprising a large number of unsingulated dice is typically processed en masse, then scribed or sawn into individual dice. Finishing operations, including packaging, are typically conducted on the singulated dice. As the sizes of connectors on state-of-the-art semiconductor dice are ever decreasing and the connector densities on semiconductor dice are ever increasing, conventional packaging processes are becoming somewhat undesirable.

The sizes of semiconductor device packages are also continually decreasing. State-of-the-art semiconductor device packages are not much larger than the semiconductor dice thereof. These small semiconductor device packages are typically referred to as "chip-scale packages," or "CSPs." Exemplary CSPs and packaging methods are disclosed in the following U.S. Pat. Nos.: 4,862,245; 5,304, 842; 5,363,279; 5,677,576; 5,684,330; 5,863,812; and 5,894,107.

The conventional transfer molding processes that are often used to package semiconductor dice are, however, somewhat undesirable when chip-scale packages are desired since it is difficult to form very small packages by transfer molding techniques. For example, transfer molding may cause wire sweep of the fine bond wires that are typically used to connect the bond pads of a semiconductor die to the contacts of a carrier substrate or to leads. When small, thin packages are required, transfer molding techniques may also inadequately cover semiconductor dice due to the formation of voids in the package polymer.

In forming a chip-scale package, a supportive, protective polymer layer may be disposed on the active surface of a semiconductor die before or after solder balls or bumps are secured to the bond pads of the semiconductor die.

When conductive structures, such as small solder balls or bumps, have already been attached to the bond pads of semiconductor dice, it is very difficult to apply a substantially void-free, conformal layer over the active surfaces thereof due to the close packing and small interstitial spacing of the conductive structures.

If the polymer layer is disposed on the active surface prior to attaching the solder balls or bumps, openings must be formed through the polymer layer to accommodate the subsequent attachment of solder balls or bumps to the bond pads. Thus, an etching or other more complex step may be required. The current chemical or mechanical methods that are used to expose bond pads through a polymer layer are undesirably time-consuming. Due to small sizes and high density of the bond pads on state-of-the-art semiconductor devices, the precision of such techniques may also be less than desired.

In some packaging techniques, only the active surfaces of semiconductor dice, or portions of the active surfaces thereof, are covered with protective material. The exposed edges of such packaged semiconductor dice remain vulnerable to damage.

None of the art of which the inventor is currently aware teaches a chip-scale package that includes a semiconductor die, leads connected to the bond pads of the semiconductor die, and a stereolithographically formed package that substantially covers the leads, but through which the leads are at least electrically exposed. Moreover, the art does not teach a method for packaging assemblies including one or more semiconductor devices and leads on a multi-device or wafer scale.

STEREOLITHOGRAPHY

In the past decade, a manufacturing technique termed "stereolithography," also known as "layered manufacturing," has evolved to a degree where it is employed in many industries.

Essentially, stereolithography, as conventionally practiced, involves utilizing a computer to generate a three-dimensional (3-D) mathematical simulation or model of an object to be fabricated, such generation usually being effected with 3-D computer-aided design (CAD) software. The model or simulation is mathematically separated or "sliced" into a large number of relatively thin, parallel, usually vertically superimposed layers, each layer having defined boundaries and other features associated with the model (and thus the actual object to be fabricated) at the level of that layer within the exterior boundaries of the object. A complete assembly or stack of all of the layers defines the entire object, and surface resolution of the object is, in part, dependent upon the thickness of the layers.

The mathematical simulation or model is then employed to generate an actual object by building the object, layer by superimposed layer. A wide variety of approaches to stereolithography by different companies has resulted in techniques for fabrication of objects from both metallic and nonmetallic materials. Regardless of the material employed to fabricate an object, stereolithographic techniques usually involve disposition of a layer of unconsolidated or unfixed material corresponding to each layer within the object boundaries, followed by selective consolidation or fixation of the material to at least a semisolid state in those areas of a given layer corresponding to portions of the object, the consolidated or fixed material also at that time being substantially concurrently bonded to a lower layer. The unconsolidated material employed to build an object may be supplied in particulate or liquid form, and the material itself may be consolidated or fixed or a separate binder material may be employed to bond material particles to one another and to those of a previously formed layer. In some instances, thin sheets of material may be superimposed to build an object, each sheet being fixed to a next lower sheet and unwanted portions of each sheet removed, a stack of such sheets defining the completed object. When particulate materials are employed, resolution of object surfaces is highly dependent upon particle size, whereas when a liquid is employed, surface resolution is highly dependent upon the minimum surface area of the liquid which can be fixed and the minimum thickness of a layer which can be generated. Of course, in either case, resolution and accuracy of object reproduction from the CAD file is also dependent upon the ability of the apparatus used to fix the material to precisely track the mathematical instructions indicating solid areas and boundaries for each layer of material. Toward that end and depending upon the layer being fixed, various fixation approaches have been employed, including particle bombardment (electron beams), disposing a binder or other fixative (such as by ink-jet printing techniques), or irradiation using heat or specific wavelength ranges.

An early application of stereolithography was to enable rapid fabrication of molds and prototypes of objects from CAD files. Thus, either male or female forms on which mold material might be disposed might be rapidly generated. Prototypes of objects might be built to verify the accuracy of the CAD file defining the object and to detect any design deficiencies and possible fabrication problems before a design was committed to large-scale production.

In more recent years, stereolithography has been employed to develop and refine object designs in relatively inexpensive materials, and has also been used to fabricate small quantities of objects where the cost of conventional fabrication techniques is prohibitive for same, such as in the case of plastic objects conventionally formed by injection molding. It is also known to employ stereolithography in the custom fabrication of products generally built in small quantities or where a product design is rendered only once. Finally, it has been appreciated in some industries that stereolithography provides a capability to fabricate products, such as those including closed interior chambers or convoluted passageways, which cannot be fabricated satisfactorily using conventional manufacturing techniques. It has also been recognized in some industries that a stereolithographic object or component may be formed or built around another, preexisting object or component to create a larger product.

However, to the inventor's knowledge, stereolithography has yet to be applied to mass production of articles in volumes of thousands or millions, or employed to produce, augment or enhance products, including flip-chip semiconductor devices, in large quantities, where minute component sizes are involved, and where extremely high resolution and a high degree of reproducibility of results are required. Furthermore, stereolithography methods have not been used to package, at the wafer level, large numbers of flip-chip type semiconductor devices of the same or differing configurations to provide packaged devices which become fully sealed upon bonding to a substrate such as a printed circuit board (PCB). In such a method, the precise location and orientation of a number of preexisting components for stereolithographic application of material thereto without the use of mechanical alignment techniques are required to assure precise, repeatable placement of components.

BRIEF SUMMARY OF THE INVENTION

The present invention includes a semiconductor device package with at least one semiconductor die, leads that are electrically connected to bond pads of the semiconductor die, and a package that substantially covers the leads.

The semiconductor die and lead frame may be of any type known in the art. For example, the semiconductor device package may include a leads-over-chip (LOC) type semiconductor die and a compatible lead frame. The bond pads of the semiconductor die can be connected to the leads by conventional means, such as by way of bond wires, thermocompression bonds, or tape automated bonds.

The leads of the semiconductor device package are at least electrically exposed through the package. In one embodiment, a small portion of each lead is physically exposed through the package. The exposed portions of the leads may be recessed below an outer surface of the package, substantially flush therewith, or protrude from the package. Conductive structures, such as balls, bumps, or pillars of metal (e.g., solders) conductive plastics, or conductor filled plastics, may be subsequently secured to the exposed portions of the leads.

In another embodiment, conductive structures that communicate with the leads are exposed through the package, the leads being substantially contained within the package. Exemplary conductive structures that are useful in the semiconductor device package of the present invention include balls, bumps, or pillars of metal (e.g., solders) conductive plastics, or conductor-filled plastics. Preferably, such conductive structures protrude from the package so as to facilitate connection of the semiconductor device package to external components.

The package covers at least the bond pads of the semiconductor die, the most proximate portions of the corresponding leads, and the connectors therebetween. The package may also cover substantially the entire active surface of the semiconductor die, as well as the peripheral edges or back side thereof. The package of the present invention is preferably a chip-scale package, the dimensions of which are preferably only slightly larger than the dimensions of the assembled semiconductor die and leads. The package, which may be fabricated by stereolithographic techniques, may include a plurality of superimposed, contiguous, mutually adhered layers of dielectric material.

According to another aspect, the present invention includes a method for fabricating the package. In a preferred embodiment of the method, a computer-controlled, 3-D CAD initiated process known as "stereolithography" or "layered manufacturing" is used to fabricate the package. When stereolithographic processes are employed, each package is formed as either a single layer or a series of superimposed, contiguous, mutually adhered layers of material.

The stereolithographic method of fabricating the packages of the present invention preferably includes the use of a machine vision system to locate the semiconductor devices or other substrates on which the packages are to be fabricated, as well as the features or other components on or associated with the semiconductor devices or other substrates (e.g., solder bumps, contact pads, conductor traces, etc.). The use of a machine vision system directs the alignment of a stereolithography system with each semiconductor device or other substrate for material disposition purposes. Accordingly, the semiconductor devices or other substrates need not be precisely mechanically aligned with any component of the stereolithography system to practice the stereolithographic embodiment of the method of the present invention.

In a preferred embodiment, the packages to be fabricated upon or positioned upon and secured to a semiconductor device component in accordance with the invention are fabricated using precisely focused electromagnetic radiation in the form of an ultraviolet (UV) wavelength laser under control of a computer and responsive to input from a machine vision system, such as a pattern recognition system, to fix or cure selected regions of a layer of a liquid photopolymer material disposed on the semiconductor device or other substrate.

Other features and advantages of the present invention will become apparent to those of skill in the art through consideration of the ensuing description, the accompanying drawings, and the appended claims.

BRIEF DESCRIPTION OF THE DRAWINGS

Examples of the invention are illustrated in the following figures, in which the dimensions are not necessarily shown to scale, wherein.

DETAILED DESCRIPTION OF THE INVENTION

Semiconductor Device Packages and Methods

FIGS. 1–27 depict a first aspect of the present invention, which includes a semiconductor device package. The semiconductor device package includes an assembly of at least one semiconductor die and leads connected to the bond pads thereof. At least a portion of the active surface of the semiconductor die, including the bond pads thereof, is covered with a protective packaging material.

Figure 1:
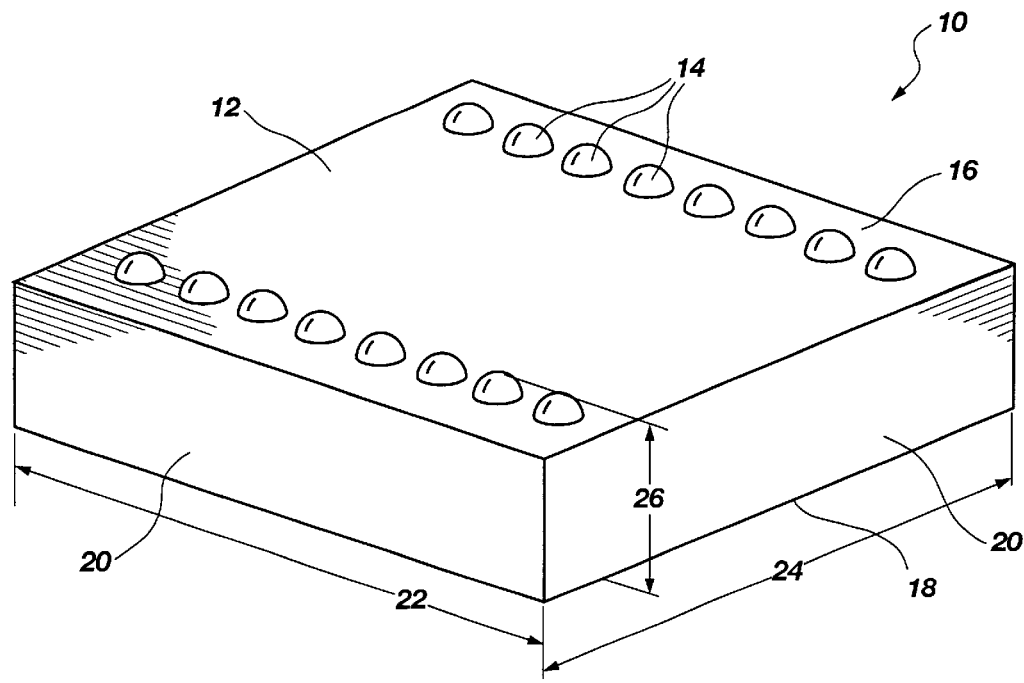
FIG. 1 is a perspective view of one embodiment of a semiconductor device package according to the present invention.

FIG. 1 illustrates an exemplary embodiment of the semiconductor device package 10 of the present invention, wherein the semiconductor device and leads (not shown) are substantially enclosed within a package 12. As shown, package 12 is a chip-scale package (CSP); i.e., the product has side dimensions 22 and 24 which are the same as (or only slightly greater than) those of the bare semiconductor die (not visible) which package 12 encloses. Package 12 surrounds and provides a protective covering around the enclosed semiconductor die and leads (not shown), and includes a top portion 16, bottom portion 18, and side portions 20. External conductive structures 14 are shown protruding through package 12. Conductive structures 14 are shown as bumps and may be formed from metal (e.g., solder), conductive elastomer, or conductor-filled elastomer. Conductive structures of other configurations, such as balls or pillars, are also useful in semiconductor device package 10. As semiconductor device package 10 includes a semiconductor die with leads thereon and conductive structures 14 communicating with the leads and protruding from package 12, the vertical dimension 26 of semiconductor device package 10, which includes the distance that conductive structures 14 project from the surface of top portion 16, may be significantly greater than the thickness of the bare semiconductor die.

FIGS. 2–13 illustrate an exemplary method of assembling and at least partially packaging a semiconductor die 30 to form a semiconductor device package 10 according to the invention. As shown, semiconductor die 30 is an unsingulated die of a wafer 28 or partial wafer.

Figure 2:
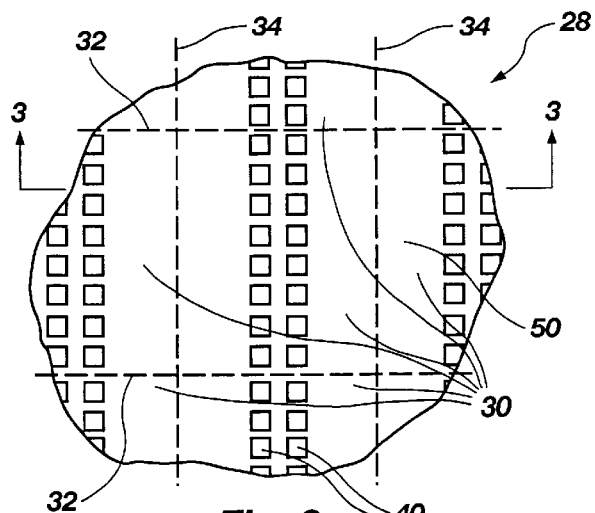
FIG. 2 is a top view of a portion of a wafer including a plurality of unsingulated semiconductor dice.
Figure 3:
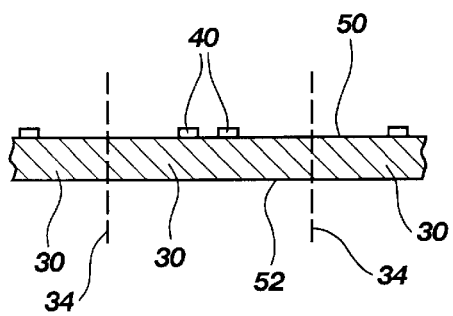
FIG. 3 is a cross-section taken along line 3—3 of FIG. 2.

FIGS. 2 and 3 illustrate a plurality of adjacent semiconductor dice 30, which are also referred to herein as "dice" for simplicity. Dice 30 are shown in FIGS. 2 and 3 as part of an unsingulated wafer 28. As illustrated, each die 30 is a leads-over-chip (LOC) type die, with the bond pads 40 thereof being arranged in substantially centrally extending rows on an active surface 50 thereof. Other types of semiconductor dice that are known in the art may also be used in semiconductor device package 10. Each die 30 also has a back side 52 opposite active surface 50. The locations of streets 32 and 34 between adjacent dice 30 are represented in phantom. Adjacent dice 30 will subsequently be separated, or singulated, from one another along streets 32 and 34, which are substantially perpendicular to one another.

Figure 4:
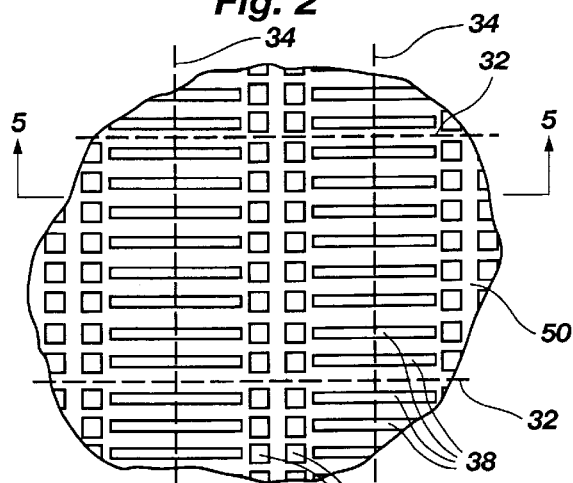
FIG. 4 is a top view of the portion of the wafer shown in FIGS. 2 and 3, depicting the orientation of at least one lead frame thereon.
Figure 5:
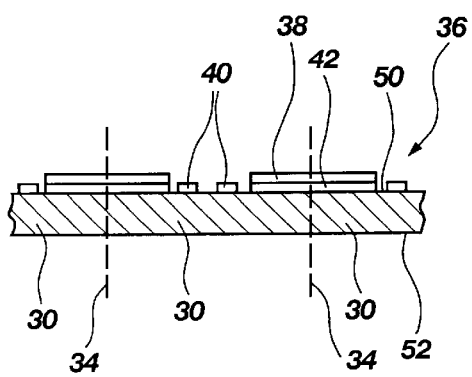
FIG. 5 is a cross-section taken along line 5—5 of FIG. 4.

With reference to FIGS. 4 and 5, a lead frame 36 including electrically conductive leads 38 is secured on active surfaces 50 of dice 30. Leads 38 closely approach bond pads 40. As illustrated, each lead 38 may extend over two laterally adjacent dice 30 to be subsequently divided into two separate leads 38 when adjacent dice 30 are separated from one another along street 34. While the lead frame 36 may be adhered to active surfaces 50 of dice 30 by any satisfactory method, a preferred method is by the use of an adhesive 42, such as an intervening adhesive film or a double-sided adhesive-coated tape such as a polyimide material. A well-known adhesive-coated polyimide tape useful in this invention is marketed under the trademark KAPTON.

Figure 6:
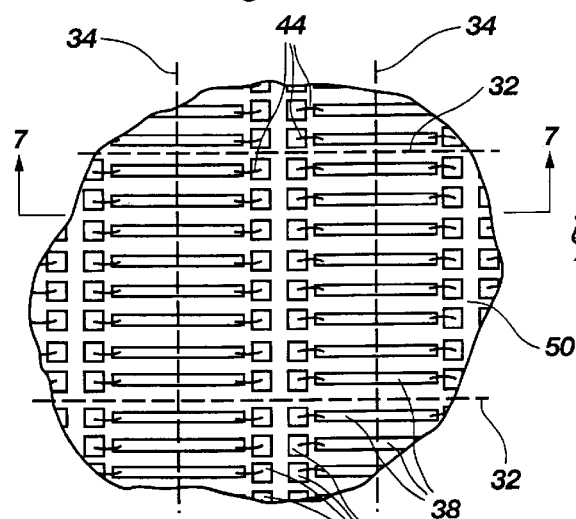
FIG. 6 is a top view of the portion of the wafer of FIGS. 4 and 5, depicting wire bonding between the bond pads of the semiconductor dice and the leads of the lead frame.
Figure 7:
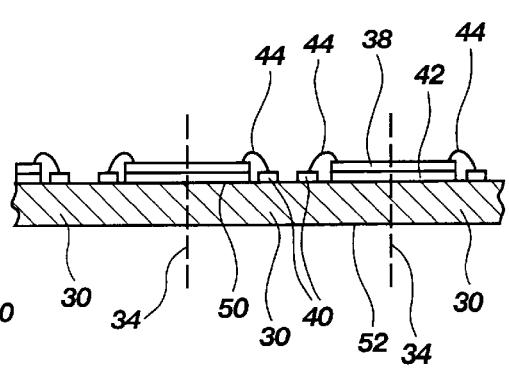
FIG. 7 is a cross-section taken along line 7—7 of FIG. 6.

As shown in FIGS. 6 and 7, bond pads 40 may be electrically connected to their corresponding leads 38 by bond wires 44. Although the exemplary electrical connections between bond pads 40 and leads 38 are shown as bond wires 44, other types of intermediate conductive elements, such as thermocompression bonds or tape automated bonds (by use of tape automated bonding (TAB)), may be used to connect bond pads 40 to leads 38.

Figure 14:
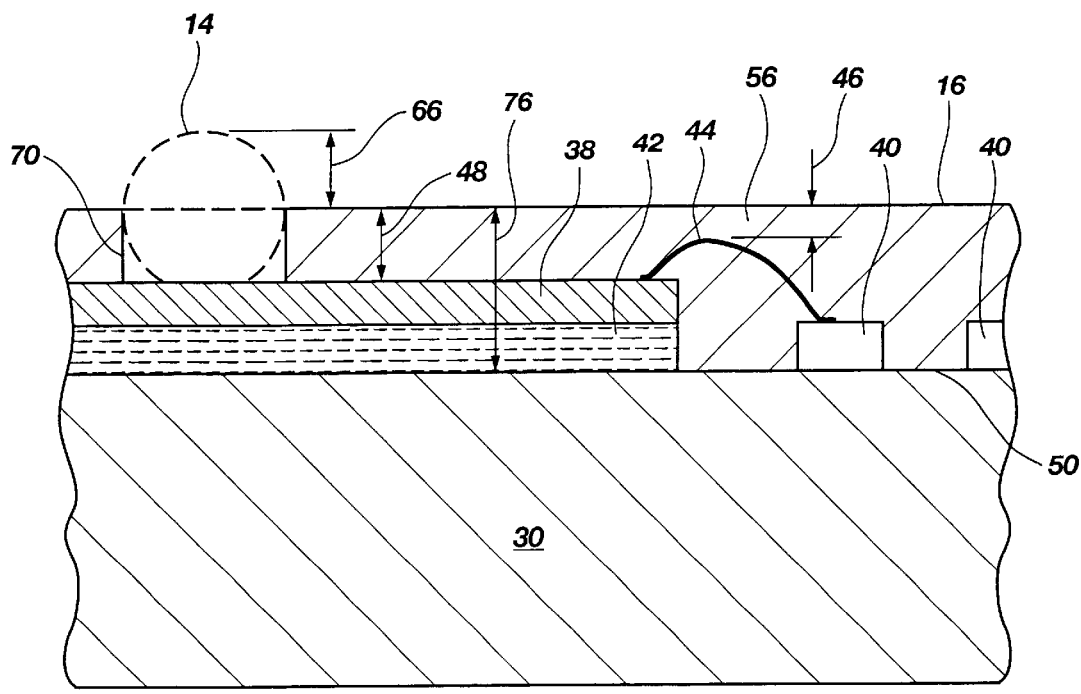
FIG. 14 is an enlarged, partial cross-sectional view of the semiconductor device shown in FIG. 11.
Figure 8:
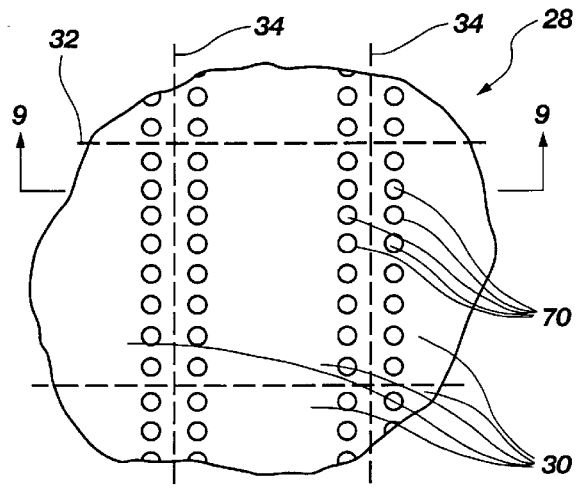
FIG. 8 is a top view of the portion of the wafer of FIGS. 6 and 7 following stereolithographic encapsulation of the active surfaces of the semiconductor dice thereof.
Figure 9:
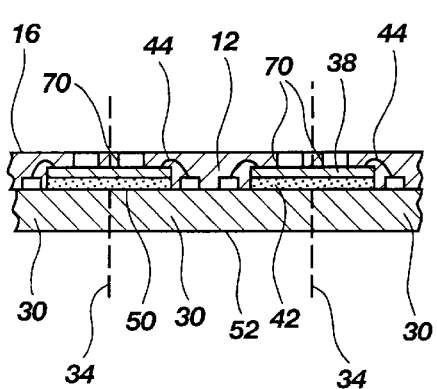
FIG. 9 is a cross-section taken along line 9—9 of FIG. 8.

FIGS. 8 and 9 illustrate the formation of a top portion 16 of package 12 over active surfaces 50, including over bond pads 40, over the portions of leads 38 proximate to bond pads 40, and over bond wires 44. As shown in FIG. 14, top portion 16 electrically isolates adjacent leads 38 and bond wires 44 from one another. Top portion 16 has a total thickness 76. The thickness 46 of the regions of top portion 16 over bond wires 44 is preferably sufficient to insulate bond wires 44, while the distance 48 from leads 38 to the outer surface of top portion 16 permits conductive structures 14 to protrude from package 20 a desired, substantially uniform distance 66, while preventing electrical shorting of leads 38 by external factors.

As illustrated, when top portion 16 is formed, portions of leads 38 may be exposed through top portion 16, such as through contact openings 70. Contact openings 70 need not be located directly above bond pads 40, but may be positioned at any location along the lengths of leads 38. Accordingly, leads 38 and contact openings 70 may be used to provide semiconductor device package 10 with a different footprint than that of semiconductor die 30 therein.

When it is desired that semiconductor device package 10 include conductive structures 14, as illustrated in FIGS. 1 and 14, contact openings 70 may be configured complementarily to the shape of conductive structures 14 to be disposed therein, or to define the shapes of portions of conductive structures 14 to be formed therein. While any known method may be used to form top portion 16 of package 12, the hereinafter disclosed stereolithography technique is preferred.

FIGS. 10–13 depict inversion of a singulated semiconductor die 30 and the formation of bottom portion 18 of package 12 on back side 52 of die 30 and side portions 20 of package 12 on peripheral edges 54 of die 30. Bottom portion 18 is shown as having a thickness 82, while side portions 20 are shown as having a thickness 80. Thicknesses 80 and 82 may be minimal, particularly where coverage is uniform and complete. Top portion 16, side portions 20, and bottom portion 18 become a unitary, substantially integral package 12 of semiconductor device package 10, the only openings therethrough being contact openings 70 through which portions of leads 38 are at least electrically exposed.

Although FIGS. 10–13 illustrate die 30 as having been singulated from wafer 28 (see, e.g., FIG. 8), bottom portion 18 may be formed prior to the singulation of die 30 from wafer 28. Each die 30, along with top portion 16 of package 12 on active surface 50 and bottom portion 18 of package 12 on back side 52, may then be singulated from wafer 28 by known techniques, such as by the use of a semiconductor wafer saw. Side portions 20 of package 12 may then be formed on the peripheral edges 54 of each of the singulated dice 30.

Alternatively, bottom portion 18 and side portions 20 of package 12 may be formed following the partial singulation of die 30 from wafer 28. Die 30 is partially singulated from wafer 28 when semiconductive material located in streets 32 and 34 is removed following the formation of a continuous top portion 16 over active surfaces 50 of two or more adjacent dice 30 of wafer 28. Known techniques, such as the use of a wafer saw, may be employed to cut completely through streets 32 and 34 without severing top portion 16 of package 12. The connected, adjacent semiconductor device packages 10 may then be separated from one another by known processes, such as by use of a wafer saw. Again, known techniques, such as the use of a semiconductor wafer saw, may be employed to partially singulate dice 30 from wafer 28.

While bottom portion 18 and side portions 20 of package 12 may be fabricated by any known technique, the use of stereolithography is preferred. As it is not as critical that back side 52 or peripheral edges 54 of a semiconductor die 30 be protected, however, the formation of a protective package over back side 52 and peripheral edges 54 is optional.

Of course, top portion 16, bottom portion 18, and side portions 20 of package 12 may be formed in any order without departing from the scope of the present invention.

If conductive structures 14 were not previously connected to leads 38, conductive structures 14 may be secured to the portions of leads 38 exposed through top portion 16 of package 12 by known processes, such as by use of solder reflow techniques.

Figure 10:
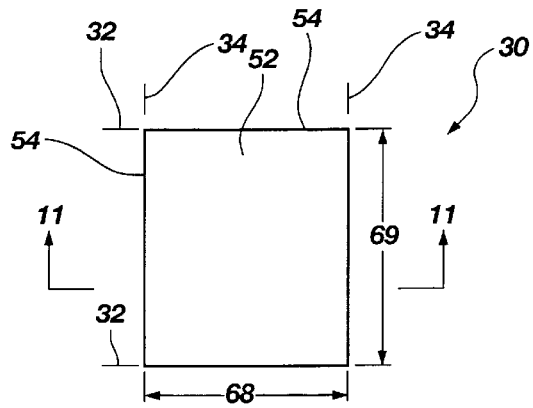
FIG. 10 is a bottom view of a semiconductor device with the active surface thereof covered with a packaging material.
Figure 11:
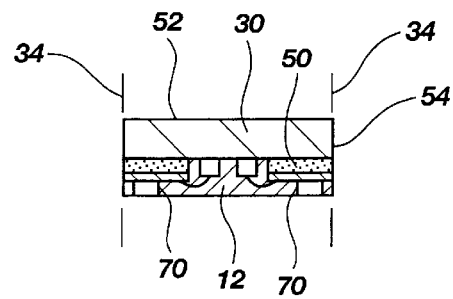
FIG. 11 is a cross-section taken along line 11—11 of FIG. 10.
Figure 12:
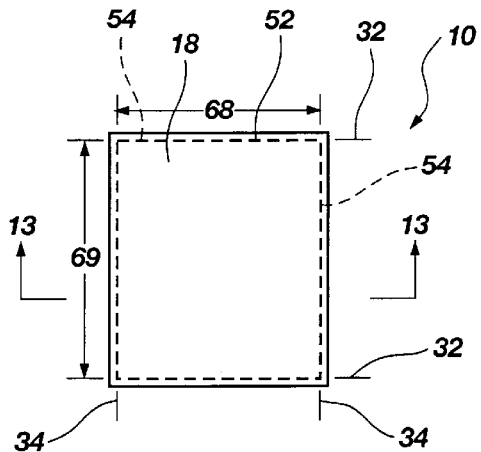
FIG. 12 is a bottom view of the semiconductor device of FIGS. 10 and 11, depicting the packaging of the back side and peripheral edges thereof.
Figure 13:
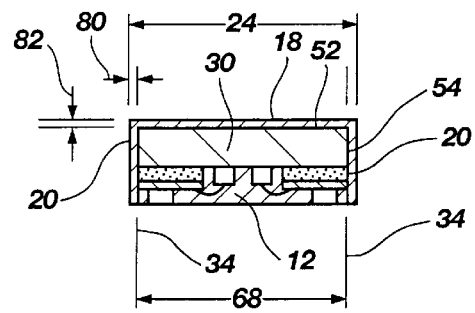
FIG. 13 is a cross-section taken along line 13—13 of FIG. 12.

The method results in a chip-scale semiconductor device package 10 with lateral side dimensions 24, 22 that are only slightly larger than the corresponding lateral dimensions 68, 69 of die 30 (see FIGS. 10 and 12).

Figure 25:
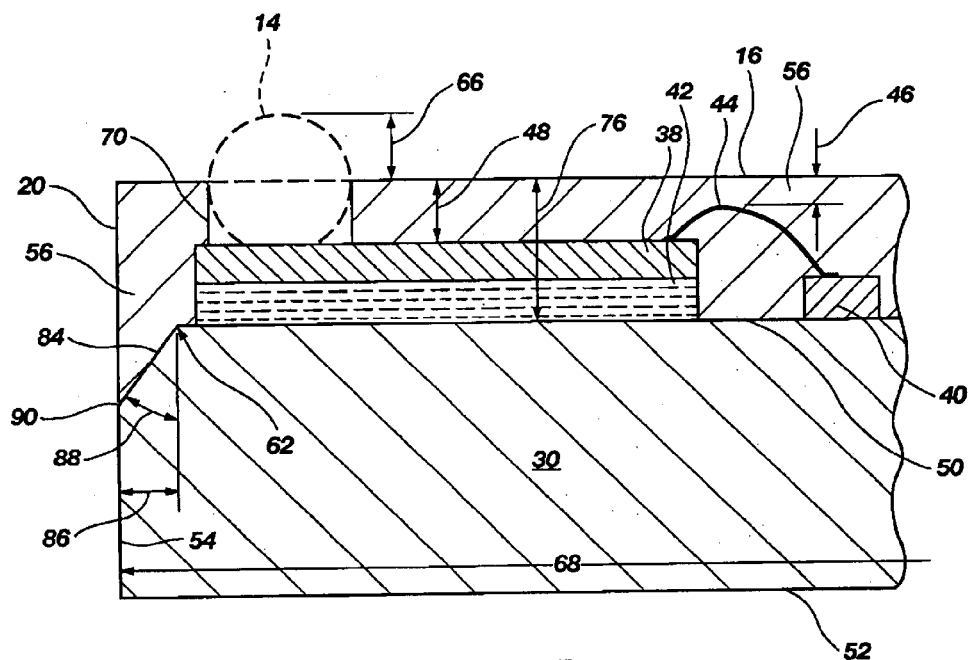
FIG. 25 is an enlarged cross-sectional representation of an end portion of the semiconductor die shown in FIGS. 23 and 24.
Figure 26:
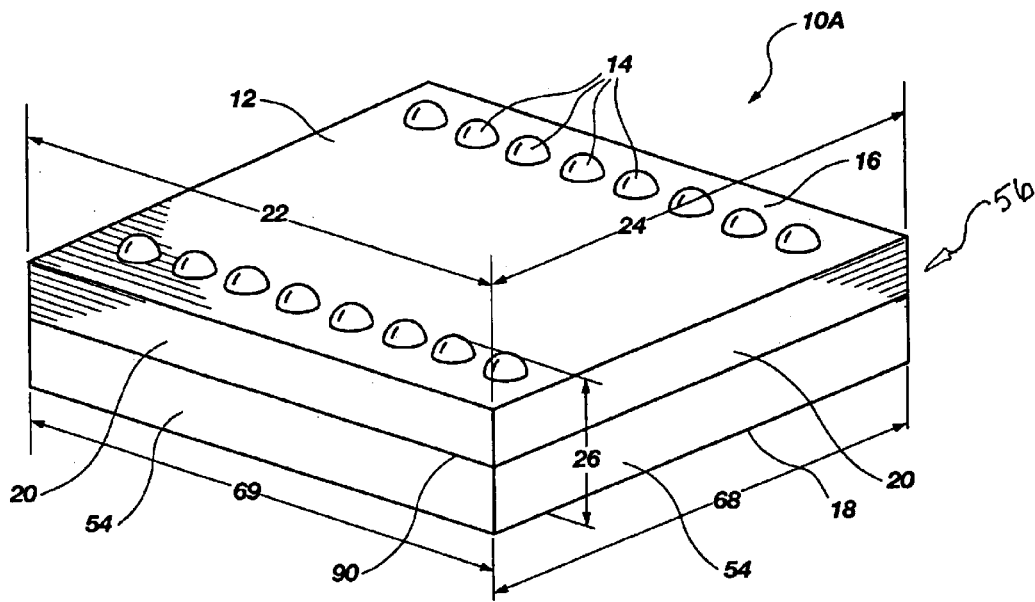
FIG. 26 is a perspective view of another embodiment of a semiconductor device package according to the present invention.

FIG. 26 shows another embodiment of a semiconductor device package 10A according to the present invention. As illustrated in FIG. 26, semiconductor device package 10A has lateral side dimensions 22, 24 which are substantially equal to the corresponding lateral dimensions 68, 69 of the singulated die 30 of semiconductor device package 10A. Semiconductor device package 10A is shown in FIG. 26 with a dielectric protective layer or structure 56 covering active surface 50 (FIG. 25) of die 30 (FIG. 25), including the lateral edges of active surface 50, and solder ball type external conductive structures communicating with circuitry of die 30 and protruding from protective layer 56. Semiconductor device package 10A may be formed by a variation of the method described above with reference to FIGS. 2–14.

Figure 15:
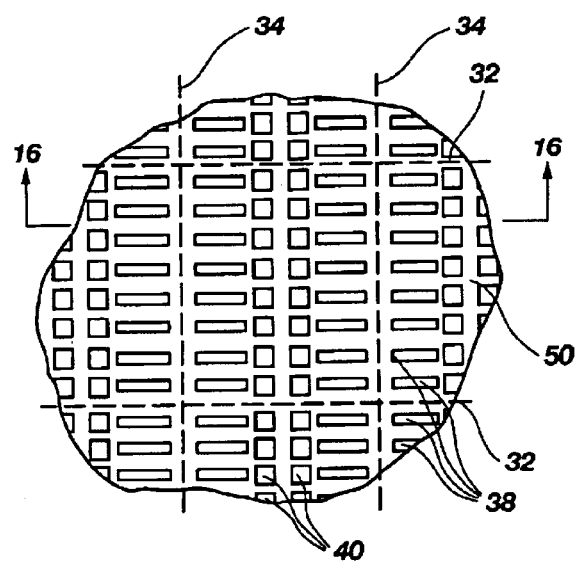
FIG. 15 is a top view of a portion of a wafer with leads secured over the active surfaces of the semiconductor dice thereof.
Figure 16:
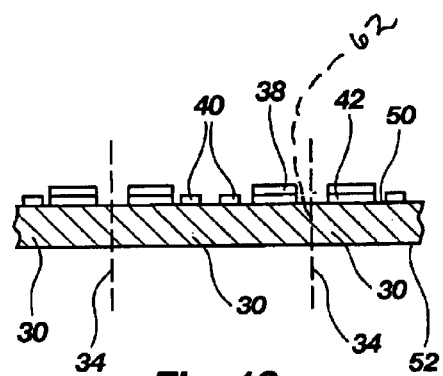
FIG. 16 is a cross-section taken along line 16—16 of FIG. 15.

As shown in FIGS. 15 and 16, semiconductor device package 10A may be formed by securing leads 38 to a wafer 28, as previously depicted in FIGS. 2 and 3 and described with reference thereto. As shown in FIGS. 15 and 16, however, leads 38 do not extend to the peripheral edges 62 of the active surface 50. Instead, leads 38 are spaced from streets 34. This placement of leads 38 facilitates the beveling of peripheral edges 62 of active surface 50 and the covering and electrical isolation of the ends of leads 38 by a dielectric protective layer 56.

Figure 17:
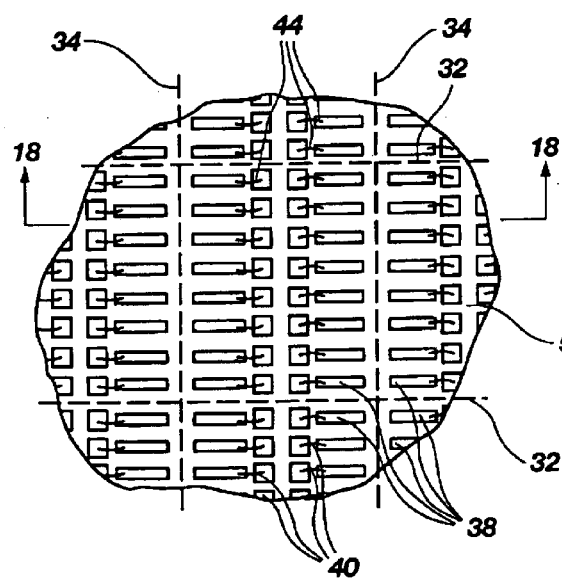
FIG. 17 is a top view of the portion of the wafer shown in FIGS. 15 and 16 following wire bonding of the leads of the semiconductor dice of the wafer to the leads disposed thereon.
Figure 18:
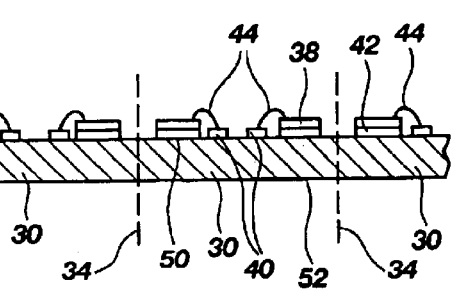
FIG. 18 is a cross-section taken along line 18—18 of FIG. 17.

As depicted in FIGS. 17 and 18, the lead fingers 38 on the active surface 50 are then connected to bond pads 40 by known processes, such as with conductive wires 44, thermocompression bonds, or tape automated bonds.

Figure 19:
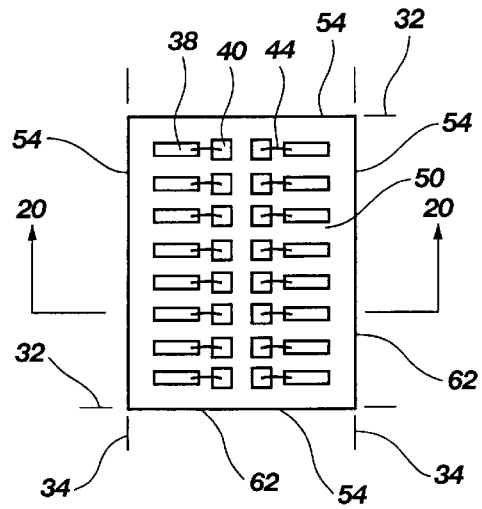
FIG. 19 is a top view of an active surface of a semiconductor die having leads wire bonded to the bond pads thereof.
Figure 20:
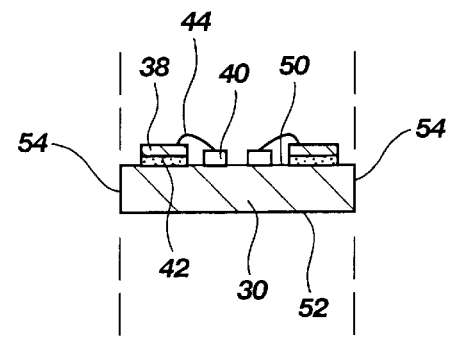
FIG. 20 is a cross-section taken along line 20—20 of FIG. 19.

Dice 30 may be singulated by known processes from wafer 28 along streets 32, 34. A singulated die 30 is shown in FIGS. 19 and 20. Peripheral edges 62 of active surface 50 are defined at the junction between peripheral edges 54 of semiconductor die 30 and active surface 50 thereof.

Figure 21:
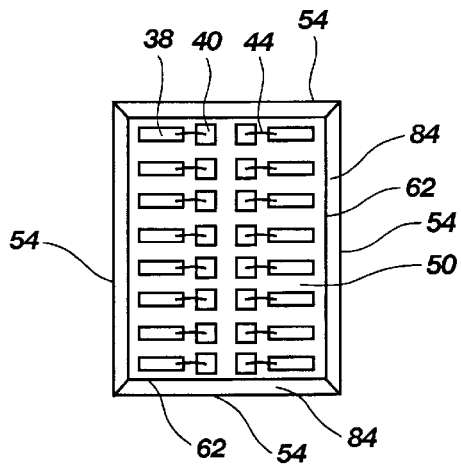
FIG. 21 is a top view of the semiconductor die of FIGS. 18 and 19, illustrating beveling at the peripheral edges of the active surface thereof.
Figure 22:
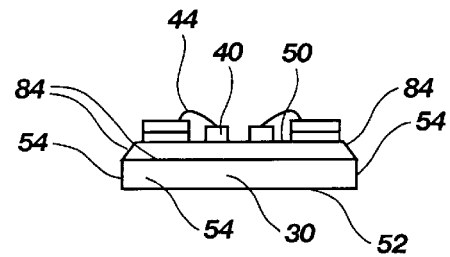
FIG. 22 is an end view of the semiconductor die of FIG. 21.

As shown in FIGS. 21, 22, and 25, peripheral edges 62 of active surface 50 may be beveled to reduce the area of the planar portion of active surface 50. Such beveling may be effected by known processes, such as mask and etch processes or by mechanical techniques (machining or cutting the wafer in the desired locations), to form a bevel 84 around the periphery of active surface 50. The angle 88 of each bevel 84 may be between about 30° and about 60°. As particularly depicted in FIG. 25, the lateral dimension 86 of each bevel 84 is preferably sufficient to enhance bonding of protective layer 56 to peripheral edges 62 of active surface 50 and, thus, to secure protective layer 56 to active surface 50. Upon disposing protective layer 56 over active surface 50, an interface 90 is formed therebetween.

Figure 23:
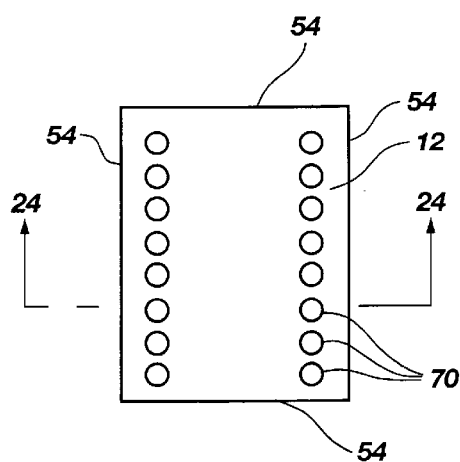
FIG. 23 is a top view of the semiconductor die of FIGS. 21 and 22 with a package covering at least the active surface thereof.
Figure 24:
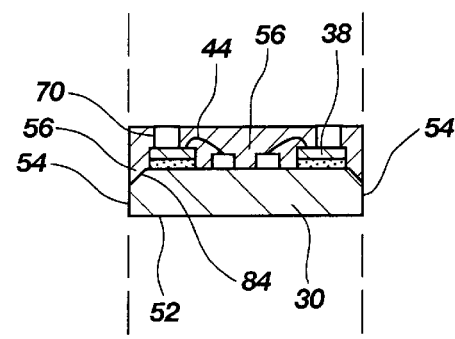
FIG. 24 is a cross-section taken along line 24—24 of FIG. 23.

FIGS. 23–25 illustrate the formation of a dielectric protective layer 56 on active surface 50 of a semiconductor die 30, including on peripheral edges 62 of active surface 50. Protective layer 56 is preferably fabricated by stereolithography processes, such as those described hereinafter. Although FIGS. 23–25 depict protective layer 56 as being fabricated on an already singulated die 30, protective layer 56 may alternatively be formed on a die 30 that has yet to be separated or singulated from a wafer, partial wafer, or other substrate.

Of course, peripheral edges 62 may be beveled prior to singulating dice 30 from wafer 28 or while dice 30 are being singulated from wafer 28.

Protective layer 56 may include contact openings 70 formed therethrough, through which portions of leads 38 are at least electrically exposed. Portions of leads 38 may be physically exposed through protective layer 56 so as to facilitate their connection and, thus, the connection of bond pads 40 of semiconductor die 30 with circuits external to semiconductor device package 10. Alternatively, as shown in FIG. 26, conductive structures 14 that are connected to leads 38 may extend through protective structure 56 to facilitate the connection of leads 38 and their corresponding bond pads 40 with circuits external to semiconductor device package 10.

With continued reference to FIG. 26, conductive structures 14 may be connected to leads 38 either before or after protective structure 56 is disposed on active surface 50 of die 30. Accordingly, contact openings 70 through protective structure 56 may be formed around predisposed conductive structures 14 or located to facilitate the subsequent placement and formation of conductive structures 14 in the desired positions on the surface of semiconductor device package 10.

Figure 27:
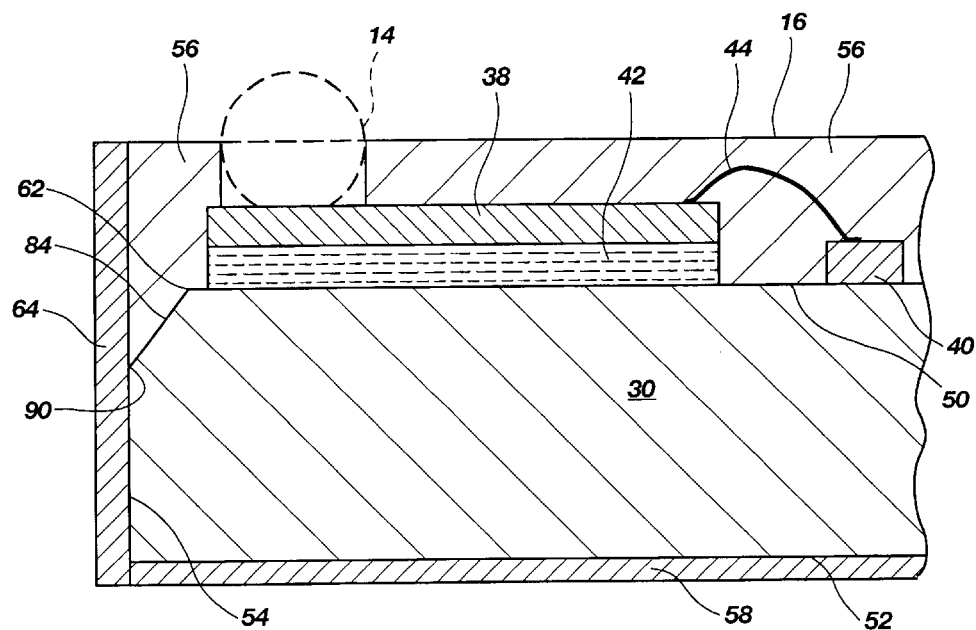
FIG. 27 is a schematic cross-sectional representation of the semiconductor device package of FIG. 26, showing the package covering the top, peripheral edges, and back side of the semiconductor die.

Turning now to FIG. 27, if desired, a protective structure 58 may be formed or placed on back side 52 of die 30. While the use of stereolithographic techniques is preferred for forming protective structure 58 on one or more inverted dice 30, other methods known in the art may also be used. Similarly, an additional protective structure 64 may optionally be formed adjacent the lateral, peripheral edges 54 of die 30, preferably by a stereolithographic method.

Stereolithographic Methods for Forming the Packages

Figure 28:
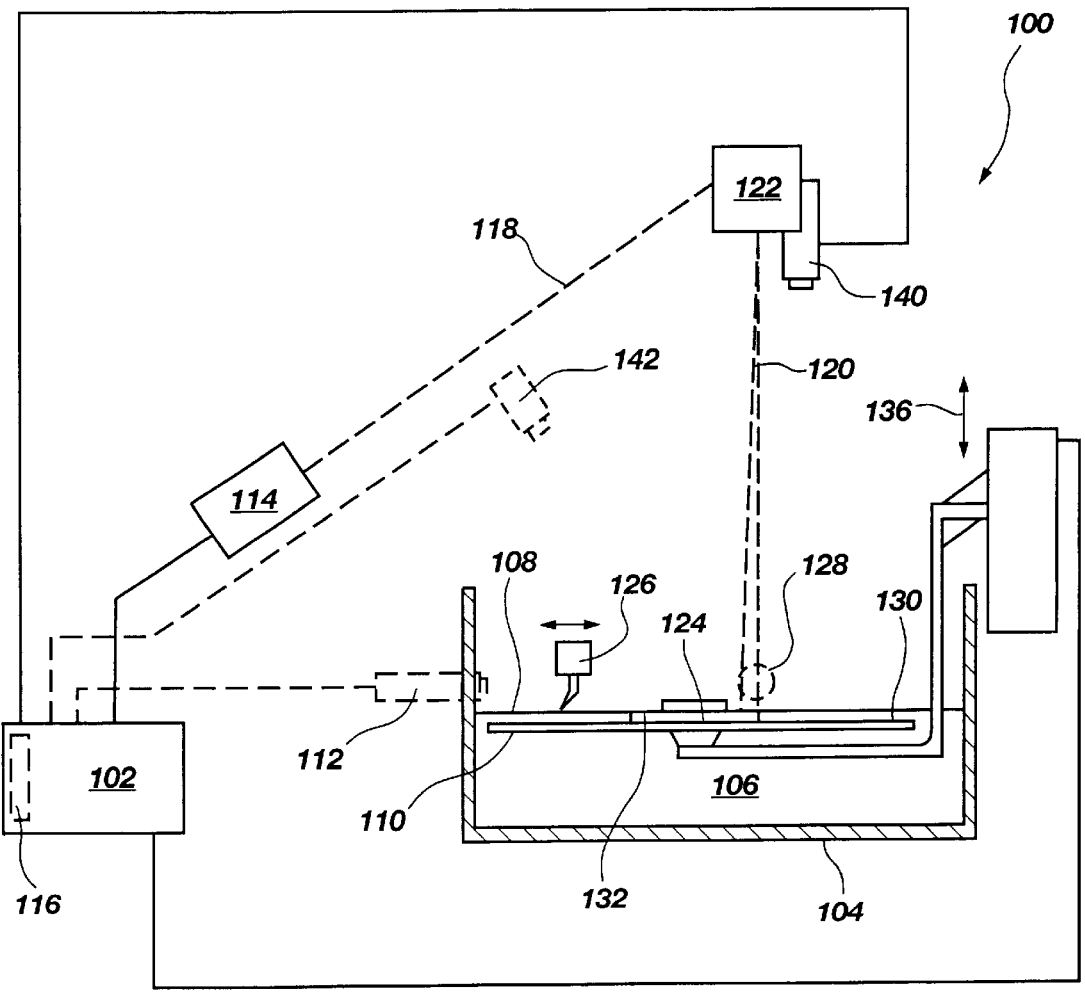
FIG. 28 is a schematic representation of an exemplary stereolithography apparatus that can be employed in the method of the present invention to fabricate the package of semiconductor device package of the present invention.

FIG. 28 depicts schematically various components, and operation, of an exemplary stereolithography apparatus 100 to facilitate the reader's understanding of the technology employed in implementation of the present invention, although those of ordinary skill in the art will understand and appreciate that apparatus of other designs and manufacture may be employed in practicing the method of the present invention. The preferred, basic stereolithography apparatus 100 for implementation of the present invention as well as operation of such apparatus are described in great detail in United States patents assigned to 3D Systems, Inc. of Valencia, Calif., such patents including, without limitation, U.S. Pat. Nos. 4,575,330; 4,929,402; 4,996,010; 4,999,143; 5,015,424; 5,058,988; 5,059,021; 5,059,359; 5,071,337; 5,076,974; 5,096,530; 5,104,592; 5,123,734; 5,130,064; 5,133,987; 5,141,680; 5,143,663; 5,164,128; 5,174,931; 5,174,943; 5,182,055; 5,182,056; 5,182,715; 5,184,307; 5,192,469; 5,192,559; 5,209,878; 5,234,636; 5,236,637; 5,238,639; 5,248,456; 5,256,340; 5,258,146; 5,267,013; 5,273,691; 5,321,622; 5,344,298; 5,345,391; 5,358,673; 5,447,822; 5,481,470; 5,495,328; 5,501,824; 5,554,336; 5,556,590; 5,569,349; 5,569,431; 5,571,471; 5,573,722; 5,609,812; 5,609,813; 5,610,824; 5,630,981; 5,637,169; 5,651,934; 5,667,820; 5,672,312; 5,676,904; 5,688,464; 5,693,144; 5,695,707; 5,711,911; 5,776,409; 5,779,967; 5,814,265; 5,850,239; 5,854,748; 5,855,718; 5,855,836; 5,885,511; 5,897,825; 5,902,537; 5,902,538; 5,904,889; 5,943,235; and 5,945,058. The disclosure of each of the foregoing patents is hereby incorporated herein by this reference. As noted in more detail below, however, a significant modification is made to conventional stereolithographic apparatus, such as those offered by 3-D Systems, Inc., in the context of initiation and control of the stereolithographic disposition and fixation of materials. Specifically, the apparatus of the present invention employs a so-called "machine vision" system in combination with suitable programming of the computer controlling the stereolithographic process to eliminate the need for accurate positioning or mechanical alignment of workpieces to which material is stereolithographically applied, and expands the use of conventional stereolithographic apparatus and methods to application of materials to large numbers of workpieces which may differ in orientation, size, thickness, and surface topography. While the workpieces employed in the practice of the preferred embodiment of the method of the invention are, by way of example only, semiconductor dice, wafers, partial wafers, other substrates of semiconductor material or carrier substrates bearing integrated circuits on dice or other semiconductor structures, the method and apparatus of the invention are applicable to fabrication of other products wherein adaptability for rapidly fabricating large numbers of parts having the aforementioned variations in orientation, size, thickness and surface topography is desired.

With reference again to FIG. 28 and as noted above, a 3-D CAD drawing of an object or structure (such as protective package structure 12 and its component layers 56, 58 and 64) to be fabricated in the form of a data file is placed in the memory of a computer 102 controlling the operation of apparatus 100 if computer 102 is not a CAD computer in which the original object design is effected. In other words, an object design may be effected in a first computer, not shown, in an engineering or research facility and the data files transferred via wide or local area network, tape, disc, CD-ROM or otherwise as known in the art to computer 102 of apparatus 100 for object fabrication.

The data is preferably formatted in an STL (for STereoLithography) file, STL being a standardized format employed by a majority of manufacturers of stereolithography equipment. Fortunately, the format has been adopted for use in many solid-modeling CAD programs, so often translation from another internal geometric database format is unnecessary. In an STL file, the boundary surfaces of an object are defined as a mesh of interconnected triangles.

Apparatus 100 also includes a reservoir 104 (which may comprise a removable reservoir interchangeable with others containing different materials) of liquid material 106 to be employed in fabricating the intended object. In the currently preferred embodiment, the liquid material 106 is a photocurable polymer (hereinafter "photopolymer") responsive to light in the UV wavelength range. The surface level 108 of the liquid material 106 is automatically maintained at an extremely precise, constant magnitude by devices known in the art responsive to output of sensors 112 within the apparatus 100 and preferably under control of computer 102. A support platform or elevator 110, precisely vertically movable in fine, repeatable increments responsive to control of computer 102, is located for movement downwardly into and upwardly out of liquid material 106 in reservoir 104. A UV range laser plus associated optics and galvanometers (collectively identified as laser 114) for controlling the scan of laser beam 118 in the X-Y plane across platform 110 has associated therewith mirror 122 to reflect laser beam 118 downwardly as beam 120 toward surface 130 of platform 110. Beam 120 is traversed in a selected pattern in the X-Y plane, that is to say, in a plane parallel to surface 130, by initiation of the galvanometers under control of computer 102 to at least partially cure, by impingement thereon, selected portions of liquid material 106 disposed over surface 130 to at least a semisolid state. The use of mirror 122 lengthens the path of the laser beam, effectively doubling same, and provides a more vertical beam 120 than would be possible if the laser 114 itself were mounted directly above platform surface 130, thus enhancing resolution.

Data from the STL files resident in computer 102 is manipulated to build an object or structure 56, 58 or 64 one layer or slice 132 at a time. Accordingly, the data mathematically representing object 56, 58 or 64 is divided into subsets, each subset representing a slice or layer 132 of the object. This is effected by mathematically sectioning the 3-D CAD model into a plurality of horizontal layers 132, a "stack" of such layers representing the object or structure being fabricated. Each slice or layer may be from about 0.0001 to about 0.0300 inch thick. As mentioned previously, a thinner slice or layer 132 promotes higher resolution by enabling better reproduction of fine vertical surface features of the structure. In some instances, a base support or supports 124 for nearly perfectly horizontally supporting the wafer 28 or die 30 may also be programmed as a separate STL file, such supports 124 being fabricated before the overlying wafer or die is placed thereon. The supports 124 facilitate fabrication of a package structure 12 on wafer 28 or die 30 with reference to a perfectly horizontal plane and removal of the object or structure from surface 130 of platform 110. Where a "recoater" blade 126 is employed as described below, the interposition of base supports 124 precludes inadvertent contact of blade 126 with surface 130. A recoater blade 126 cannot be used in forming the protective structure 56 because of interference with bond pads 40, leads fingers 38 and bond wires 44 on the active surface 50 of dice 30.

Before fabrication of an object or structure is initiated with apparatus 100, the primary STL file for the protective structure 56, 58 or 64 and the file for base support(s) 124 are merged. It should be recognized that, while reference has been made to a single structure or object, multiple objects may be concurrently fabricated on surface 130 of platform 110. For example, a large number of devices 10 on a wafer 28 may have differing configurations requiring differing STL file input. In such an instance, the STL files for the various objects and supports, if any, are merged. Operational parameters for apparatus 100 are then set, for example, to adjust the size (diameter, if circular) of the laser beam 120 used to cure liquid material 106.

Figure 29:
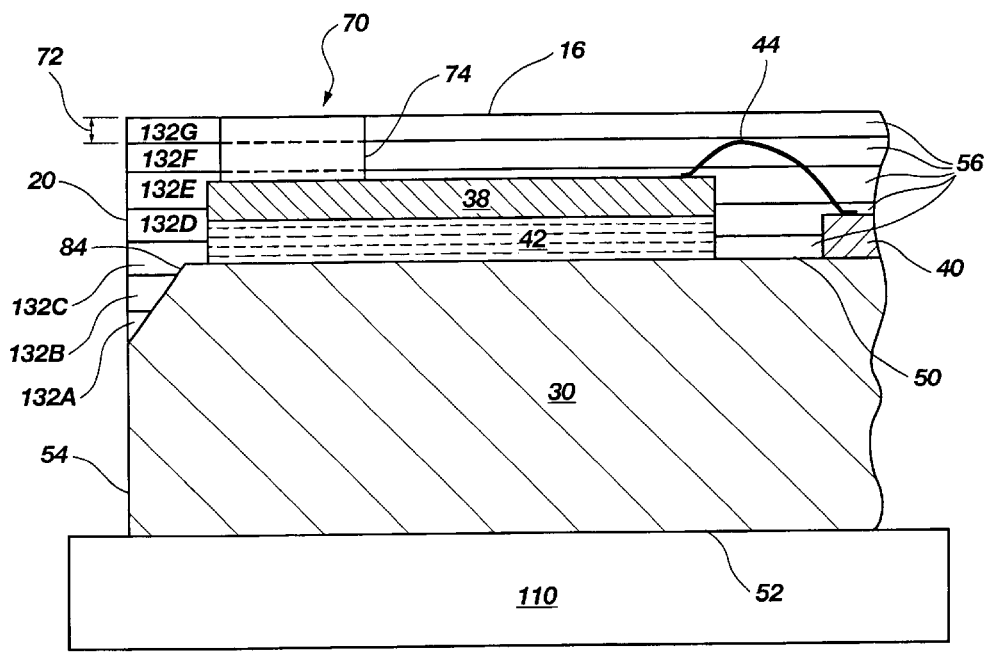
FIG. 29 is a partial cross-sectional side view of a semiconductor device disposed on a platform of a stereolithographic apparatus for the formation of the package.

Before initiation of a first layer 132A for a support 124 or protective structure 56, 58 or 64 is commenced, computer 102 automatically checks and, if necessary, adjusts by means known in the art, as referenced above, the surface level 108 of liquid material 106 in reservoir 104 to maintain same at an appropriate focal length for laser beam 120. U.S. Pat. No. 5,174,931, referenced above and previously incorporated herein by reference, discloses one suitable level control system. Alternatively, the height of mirror 122 may be adjusted responsive to a detected surface level 108 to cause the focal point of laser beam 120 to be located precisely at the surface of liquid material 106 at surface level 108 if level 108 is permitted to vary, although this approach is somewhat more complex. With reference to FIGS. 28 and 29, the platform 110 is shown as being submerged in liquid material 106 in reservoir 104 to a depth equal to the thickness of one layer or slice 132A of the structure. The liquid surface level 108 is adjusted as required to accommodate liquid material 106 displaced by submergence of platform 110. Laser 114 is then activated so that laser beam 120 will scan liquid material 106 over the liquid surface level 108 to at least partially cure (e.g., at least partially polymerize) liquid material 106 at selective locations, defining the boundaries of a layer 132A (of protective structure 56 for example) and filling in solid portions thereof. Platform 110 is then lowered by a distance equal to the thickness of a second layer 132B, raised to a depth equal to the thickness thereof, and the laser beam 120 scanned again to define and fill in the second layer 132B while simultaneously bonding the second layer to the first. The process is then repeated, layer by layer, until the structure 56 comprising layers 132A, 132B, 132C, 132D, 132E, 132F, and 132G is completed. The protective structure 56 is formed to have an upper surface 16 and lateral sides 20.

The layer thickness 72 may vary from layer to layer 132 of package 12, and is controlled from the computer 102 to maintain the desired dimensions of structure 56. No laser radiation is applied in openings 70 which extend downwardly to the leads 38. The resulting structure 56 fills the spaces between leads 38, bond pads 40, and bond wires 44. The openings 70 have precise lateral and vertical dimensions by which a uniform array of external conductive structures 14 may be formed.

If a recoater blade 126 is employed, as in forming protective layer 58 on the back side 52 of a die 30, the process sequence is somewhat different. In this instance, the surface 130 of platform 110 is lowered into liquid material 106 below surface level 108, then raised thereabove until it is precisely one layer's thickness below blade 126. Blade 126 then sweeps horizontally over surface 130, or (to save time) at least over a portion thereof on which protective structure 56 is to be built, to remove excess liquid material 106 and leave a film thereof of the precise desired thickness above surface 130. Platform 110 is then lowered so that the surface of the film and liquid material level 108 are coplanar and the surface of the liquid material 106 is still. Laser 114 is then initiated to scan with laser beam 120 and define a first layer 132A. The process is repeated, layer by layer, to define each succeeding layer and simultaneously bond same to the next lower layer until the protective structure 56 is completed. A more detailed discussion of this sequence and apparatus for performing same is disclosed in U.S. Pat. No. 5,174,931, previously incorporated herein by reference.

As an alternative to the above approach to preparing a layer 132 of liquid material 106 for scanning with laser beam 120, a layer of liquid material 106 may be formed on platform surface 130, die 30 or wafer 28 by lowering platform 110 to flood material over the surface, die or wafer, or the highest completed layer of the structure 56, 58 or 64 being fabricated, then raising platform 110 and horizontally traversing a so-called "meniscus blade" across the platform 110 or formed portion of the structure one layer thickness thereabove, followed by initiation of laser 114 and scanning of beam 120 to define the next higher layer.

Another alternative to layer preparation of liquid material 106 is to merely lower platform 110 in direction 136 to a depth equal to a layer 132 of liquid material 106 over the previously formed layer, and then traverse a combination flood bar and meniscus bar assembly horizontally over the structure being formed to substantially concurrently flood liquid material 106 over the structure 56, 58 or 64 and define a precise layer thickness of liquid material 106 for scanning.

All of the foregoing approaches to liquid material flooding and layer definition and apparatus for initiation thereof are known in the art and are not material to the practice of the present invention, so no further details relating thereto will be provided herein.

Each layer 132 of structure 56, 58 or 64 is preferably built by first defining any internal and external object boundaries of that layer with laser beam 120, then hatching solid areas of the structure with the laser beam. If a particular part of a particular layer 132 is to form a boundary of a void in the object above or below that layer, then the laser beam 120 is scanned in a series of closely-spaced, parallel vectors so as to develop a continuous surface, or skin, with improved strength and resolution. The time it takes to form each layer 132 depends upon its geometry and the surface tension and viscosity of liquid material 106, and thickness of the layer.

Once the structure 56, 58 or 64 is completed, platform 110 is elevated above surface level 108 of liquid material 106, and the platform 110 with the wafer 28 or die 30 may be removed from apparatus 100. Excess, uncured liquid material 106 on the surface of the wafer 28 or die 30 may be manually removed, followed by solvent cleaning and removal from platform 110, usually by cutting it free of base supports 124. The stereolithographically formed structure(s) may then require postcuring, as liquid material 106 may be only partially polymerized and exhibit only a portion (typically 40% to 60%) of its fully cured strength. Postcuring to completely harden the structures 56, 58 or 64 may be effected in another apparatus projecting UV radiation in a continuous manner over the wafer 28 or die 30 and/or by thermal completion of the initial, UV-initiated partial cure.

In practicing the present invention, a commercially available stereolithography apparatus operating generally in the manner as that described above with respect to apparatus 100 of FIG. 28 is preferably employed, but with further additions and modifications as hereinafter described for practicing the method of the present invention. For example and not by way of limitation, the SLA-250/50HR, SLA-5000 and SLA-7000 stereolithography systems, each offered by 3D Systems, Inc., of Valencia, Calif., are suitable for modification. Photopolymers believed to be suitable for use in practicing the present invention include Cibatool SL 5170 and SL 5210 resins for the SLA-250/50HR system, Cibatool SL 5530 resin for the SLA-5000 System and Cibatool SL 7510 for the SLA-7000 system. All of these resins are available from Ciba Specialty Chemicals Inc. By way of example and not limitation, the layer thickness of liquid material 106 to be formed, for purposes of the invention, may be on the order of 0.001 to 0.020 inch, with a high degree of uniformity over a field on a surface 130 of a platform 110. It should be noted that different material layers 132 may be of different heights or thicknesses, so as to form a structure 56, 58 or 64 of a precise, intended total height or thickness, or to provide different material thicknesses for different portions of the structure. The size of the laser beam "spot" 128 impinging on the surface of liquid material 106 to cure same may be on the order of 0.002 inch to 0.008 inch across. Resolution is preferably ±0.0003 inch in the X-Y plane (parallel to surface 130) over at least a 0.5 inch×0.25 inch field from a center point, permitting a high resolution scan effectively across a 1.0 inch×0.5 inch area. Of course, it is desirable to have substantially this high a resolution across the entirety of the platform surface 130, die 30 or wafer 28 to be scanned by laser beam 120, which area may be termed the "field of exposure," such area being substantially coextensive with the vision field of a machine vision system employed in the apparatus of the invention as explained in more detail below. The longer and more effectively vertical the path of laser beam 118/120, the greater the achievable resolution.

Referring again to FIG. 28 of the drawings, it should be noted that apparatus 100 useful in the method of the present invention includes a camera 140 (and, optionally, additional camera 142) which is in communication with computer 102 and preferably located, as shown, in close proximity to range laser 114 located above surface 130 of platform 110. Camera 140 may be any one of a number of commercially available cameras, such as capacitive-coupled discharge (CCD) cameras available from a number of vendors. Suitable circuitry as required for adapting the output of camera 140 for use by computer 102 may be incorporated in a board 116 installed in computer 102, which is programmed as known in the art to respond to images generated by camera 140 and processed by board 116. Camera 140 and board 116 may together comprise a so-called "machine vision system," and specifically a "pattern recognition system" (PRS), the operation of which will be described briefly below for a better understanding of the present invention. Alternatively, a self-contained machine vision system available from a commercial vendor of such equipment may be employed. For example, and without limitation, such systems are available from Cognex Corporation of Natick, Mass. For example, the apparatus of the Cognex BGA Inspection Package™ or the SMD Placement Guidance Package™ may be adapted to the present invention, although it is believed that the MVS-8000™ product family and the Checkpoint® product line, the latter employed in combination with Cognex PatMax™ software, may be especially suitable for use in the present invention.

It is noted that a variety of machine vision systems are in existence, examples of which and their various structures and uses are described, without limitation, in U.S. Pat. Nos. 4,526,646; 4,543,659; 4,736,437; 4,899,921; 5,059,559; 5,113,565; 5,145,099; 5,238,174; 5,463,227; 5,288,698; 5,471,310; 5,506,684; 5,516,023; 5,516,026; and 5,644,245. The disclosure of each of the immediately foregoing patents is hereby incorporated by this reference.

In order to facilitate practice of the present invention with apparatus 100, a data file representative of the size, configuration, thickness and surface topography of the active surface 50 of, for example, a particular type and design of the assembly of a semiconductor die 30 (either individually, as a group of separate dice, or in the wafer or partial wafer stage) and leads 38 to be packaged is placed in the memory of computer 102. If packaging material in the form of the aforementioned photopolymer is to be applied only to active surfaces 50 of dice 30, or to active surfaces 50 and back sides 52 of dice 30, a large plurality of such dice 30 in the form of a wafer 28, portions of a wafer, or singulated dice 30 may be placed on surface 130 of platform 110 for packaging, as depicted in FIG. 28. Camera 140 is then activated to locate the position and orientation of each die 30 to be packaged by scanning platform 110 and comparing the features of the dice 30 with those in the data file residing in memory, the locational and orientational data for each die 30 of wafer 28 including data relating to the bond pads 40, leads 38 and external conductive structures 14 then also being stored in memory. It should be noted that the data file representing the design size, shape and topography for the dice 30 may be used at this juncture to detect physically defective or damaged dice prior to stereolithographic packaging and to automatically delete such dice 30 at singulation. It should also be noted that data files for more than one type (size, thickness, configuration, surface topography) of die 30 may be placed in computer memory and computer 102 programmed to recognize not only die locations and orientations, but which type of die 30 is at each location so that material 106 may be cured by laser beam 120 in the correct pattern and to the height required to define the structure being fabricated.

The use of stereolithography to form packages in accordance with teachings of the present invention facilitates packaging at least the active surfaces of semiconductor dice at the wafer level. Thus, at least the active surfaces of dice may be protected before the dice must be individually handled. Accordingly, the likelihood that individual dice will be damaged during handling thereof is reduced.

Moreover, the stereolithographic technique disclosed herein facilitates the formation of packages having only the necessary thickness dimensions. Accordingly, semiconductor device packages with lateral dimensions that are substantially the same as the lateral dimensions of the semiconductor dice therein can be manufactured.

In addition, the use of stereolithography facilitates the precise positioning of contact openings in the desired locations in situ with the formation of the package. Thus, additional material removal steps, which require realignment, are avoided.

Photopolymers that are useful as liquid material 106 exhibit a desirable dielectric constant, exhibit low shrinkage upon cure, are of sufficient (i.e., semiconductor grade) purity, exhibit good adherence to other semiconductor device materials, and have a similar coefficient of thermal expansion (CTE) to the material of conductive structures 14 (FIG. 1) (e.g., solder or other metal or metal alloy). As used herein, the term "solder ball" may also be interpreted to encompass conductive or conductor-filled epoxy. Preferably, the CTE of liquid material 106 is sufficiently similar to that of conductive structures 14 to prevent undue stressing thereof during thermal cycling of semiconductor device packages 10 or another substrate in testing, subsequent processing, and subsequent, normal operation. Exemplary photopolymers exhibiting these properties are believed to include, but are not limited to, the above-referenced resins from Ciba Specialty Chemicals Inc. One area of particular concern in determining resin suitability is the substantial absence of mobile ions, and specifically fluorides.

Voids and open spaces (e.g., between close leads or bond wires) are also less likely to form in the photopolymer materials used in the stereolithography process disclosed herein than in many conventional packaging materials. Thus, the integrity of the packages formed by the stereolithographic method is more consistent.

It is notable that the method of the present invention, in addition to eliminating the capital equipment expense of transfer molding processes, is extremely frugal in its use of dielectric photopolymer liquid material 106, since all such material in which cure is not initiated by laser beam 120 remains in a liquid state in reservoir 104 for use in treating the next wafer, die or substrate.

Further, the high precision of the stereolithography process facilitates the formation of semiconductor device packages 10 having consistent dimensions. Surprisingly, the package dimensional tolerances achievable through use of the present invention are more precise, e.g., three times more precise, than those of which a transfer molding system is capable, and there is no need for an inclined mold side wall (and thus extra packaging material) to provide a release angle to facilitate removal of a packaged die from a mold cavity. Moreover, there is no potential for mold damage or mold wear, or requirement for mold refurbishment. Finally, the extended cure times at elevated temperatures, on the order of about four hours at 175° C., required after removal of batches of dice from the transfer mold cavities are eliminated. Post-cure of die packages formed according to the present invention may be effected with broad-source UV radiation emanating from, for example, flood lights in a chamber through which dice are moved on a conveyor, or in large batches. Additionally, the protective package 12, having portions shadowed by solder balls, may be fully cured in an oven at a relatively low temperature such as, for example, 160° C.

It should also be noted that the packaging method of the present invention is conducted at substantially ambient temperature, the small beam spot size and rapid traverse of laser beam 120 around and over the wafer 28 or semiconductor dice 30 resulting in negligible thermal stress thereon.

While the present invention has been disclosed in terms of certain preferred embodiments, those of ordinary skill in the art will recognize and appreciate that the invention is not so limited. Additions, deletions and modifications to the disclosed embodiments may be effected without departing from the scope of the invention as claimed herein. Similarly, features from one embodiment may be combined with those of another while remaining within the scope of the invention.

What is claimed is:

1. A semiconductor device package, comprising:
   at least one semiconductor die with bond pads on an active surface thereof;
   leads electrically connected to said bond pads; and
   a package structure covering at least a portion of said active surface, including connections between said bond pads and said leads, at least a portion of said package structure comprising a plurality of superimposed, contiguous, mutually adhered layers comprising photopolymer through which said connections extend and which overlie at least portions of said leads, said leads being at least electrically exposed through said package structure.

2. The semiconductor device package of claim 1, wherein said at least one semiconductor die comprises a leads-over-chip type semiconductor die.

3. The semiconductor device package of claim 1, wherein said at least one semiconductor die comprises at least a portion of a semiconductor substrate including a plurality of unsingulated semiconductor dice thereon.

4. The semiconductor device package of claim 3, wherein said semiconductor substrate comprises a semiconductor wafer.

5. The semiconductor device package of claim 1, wherein said bond pads and said leads are connected by bond wires.

6. The semiconductor device package of claim 1, wherein said bond pads and said leads are connected by thermocompression bonds.

7. The semiconductor device package of claim 1, wherein said bond pads and said leads are connected by tape automated bonding.

8. The semiconductor device package of claim 1, wherein said package structure substantially covers said active surface.

9. The semiconductor device package of claim 1, wherein said package structure covers at least a portion of at least one peripheral edge of said at least one semiconductor die.

10. The semiconductor device package of claim 1, wherein said package structure covers at least a portion of a back side of said at least one semiconductor die.

11. The semiconductor device package of claim 1, wherein said package structure covers substantially all of said at least one semiconductor die.

12. The semiconductor device package of claim 1, wherein portions of selected leads are exposed through said package structure.

13. The semiconductor device package of claim 1, further comprising conductive structures in contact with selected leads and protruding therefrom.

14. The semiconductor device package of claim 13, wherein at least some of said conductive structures protrude through said package structure.

15. The semiconductor device package of claim 13, wherein said conductive structures comprise at least one of metal, conductive elastomer, and conductor filled elastomer.

16. The semiconductor device package of claim 13, wherein said conductive structures are configured as at least one of balls, bumps, or columns.

17. A semiconductor device package, comprising:
   at least one semiconductor die with bond pads on an active surface thereof;
   leads electrically connected to said bond pads; and
   a package structure covering at least a portion of said active surface, including connections between said bond pads and said leads, at least a portion of said package structure comprising a plurality of superimposed, contiguous, mutually adhered layers comprising photopolymer through which said connections extend and covering portions of said leads, other portions of each of said leads being exposed through said package structure.

18. The semiconductor device package of claim 17, wherein said at least one semiconductor die comprises a leads-over-chip type semiconductor die.

19. The semiconductor device package of claim 17, wherein said at least one semiconductor die comprises at least a portion of a semiconductor substrate including a plurality of unsingulated semiconductor dice thereon.

20. The semiconductor device package of claim 19, wherein said semiconductor substrate comprises a semiconductor wafer.

21. The semiconductor device package of claim 17, wherein said bond pads and said leads are connected by bond wires.

22. The semiconductor device package of claim 17, wherein said bond pads and said leads are connected by thermocompression bonds.

23. The semiconductor device package of claim 17, wherein said bond pads and said leads are connected by tape automated bonding.

24. The semiconductor device package of claim 17, wherein said package structure substantially covers said active surface.

25. The semiconductor device package of claim 17, wherein said package structure covers at least a portion of at least one peripheral edge of said at least one semiconductor die.

26. The semiconductor device package of claim 17, wherein said package structure covers at least a portion of a back side of said at least one semiconductor die.

27. The semiconductor device package of claim 17, wherein said package structure covers substantially all of said at least one semiconductor die.

28. A semiconductor device package, comprising:
   at least one semiconductor die with bond pads on an active surface thereof;
   leads electrically connected to said bond pads;
   a package structure covering at least a portion of said active surface, including connections between said bond pads and said leads, at least a portion of said package structure comprising a plurality of superimposed, contiguous, mutually adhered layers comprising photopolymer which overlie portions of said leads; and
   conductive structures in contact with at least some of said leads, said conductive structures extending through and protruding from said package structure.

29. The semiconductor device package of claim 28, wherein said at least one semiconductor die comprises a leads-over-chip type semiconductor die.

30. The semiconductor device package of claim 28, wherein said at least one semiconductor die comprises at least a portion of a semiconductor substrate including a plurality of unsingulated semiconductor dice thereon.

31. The semiconductor device package of claim 30, wherein said semiconductor substrate comprises a semiconductor wafer.

32. The semiconductor device package of claim 28, wherein said bond pads and said leads are connected by bond wires.

33. The semiconductor device package of claim 28, wherein said bond pads and said leads are connected by thermocompression bonds.

34. The semiconductor device package of claim 28, wherein said bond pads and said leads are connected by tape automated bonding.

35. The semiconductor device package of claim 28, wherein said package structure substantially covers said active surface.

36. The semiconductor device package of claim 28, wherein said package structure covers at least a portion of at least one peripheral edge of said at least one semiconductor die.

37. The semiconductor device package of claim 28, wherein said package structure covers at least a portion of a back side of said at least one semiconductor die.

38. The semiconductor device package of claim 28, wherein said package structure covers substantially all of said at least one semiconductor die.

39. The semiconductor device package of claim 28, wherein said conductive structures comprise at least one of metal, conductive elastomer, and conductor-filled elastomer.

40. The semiconductor device package of claim 28, wherein said conductive structures are configured as at least one of balls, bumps, or columns.

* * * * *